(12) United States Patent
Yamada et al.

(10) Patent No.: US 7,499,148 B2
(45) Date of Patent: Mar. 3, 2009

(54) POLARIZER, PROJECTION LENS SYSTEM, EXPOSURE APPARATUS AND EXPOSING METHOD

(75) Inventors: Tetsuya Yamada, Tokyo (JP); Atsushi Ueno, Kanagawa (JP); Ritsuko Ueno, legal representative, Kanagawa (JP); Takashi Okagawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 334 days.

(21) Appl. No.: 10/883,007

(22) Filed: Jul. 2, 2004

(65) Prior Publication Data

US 2005/0041232 A1    Feb. 24, 2005

(30) Foreign Application Priority Data

Jul. 2, 2003    (JP)    ............... 2003-190205

(51) Int. Cl.
*G03B 27/72*    (2006.01)
(52) U.S. Cl. ..................................... 355/71
(58) Field of Classification Search ............ 355/71, 355/53, 30; 359/489, 499, 500, 494
See application file for complete search history.

(56) References Cited

U.S. PATENT DOCUMENTS

| 4,286,843 | A | * | 9/1981 | Reytblatt | ............ 359/489 |
| 5,365,371 | A | | 11/1994 | Kamon | |
| 5,436,761 | A | | 7/1995 | Kamon | |
| 6,333,780 | B1 | | 12/2001 | Tsukuda | |
| 2002/0176166 | A1 | * | 11/2002 | Schuster | ............ 359/494 |
| 2004/0119954 | A1 | * | 6/2004 | Kawashima et al. | ............ 355/30 |

FOREIGN PATENT DOCUMENTS

| JP | 5-226225 | 9/1993 |
| JP | 2001-185476 | 7/2001 |

OTHER PUBLICATIONS

Smith, Bruce., et al. "Challenges in high NA, polarization, and photoresists." Optical Microlithography XV, Proceedings of SPIE vol. 4691, 2002, pp. 11-24.
Nitto Denko Website: <URL: http://www.nitto.co.jp/product/industry/electronics/output/lcds/polar/index/html> pp. 5, 2004.

* cited by examiner

*Primary Examiner*—Peter B Kim
(74) *Attorney, Agent, or Firm*—McDermott Will & Emery LLP

(57) ABSTRACT

The directions of amplitude of polarized light passing through a polarizer are concentric around a position. The polarizer is disposed on the surface of a pupil such that the position lies exactly on the center of the surface of the pupil. Rays of luminous flux of illumination light converted into polarized light by the polarizer are converged onto a wafer with concentric planes of polarization with respect to an optical axis. The illumination light is therefore incident on a photoresist as s-polarized light. Thus, the amount of light entering the photoresist is less likely to depend upon the angle of incidence. Consequently, the contrast of an optical image formed in the photoresist is improved, and hence, resolution characteristics are improved.

3 Claims, 7 Drawing Sheets

F I G . 2
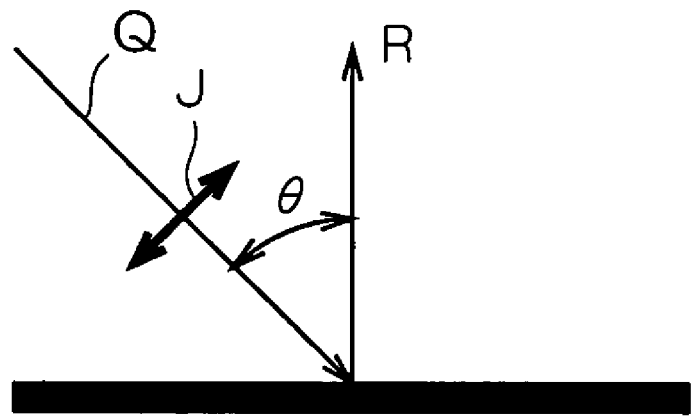
F I G . 3
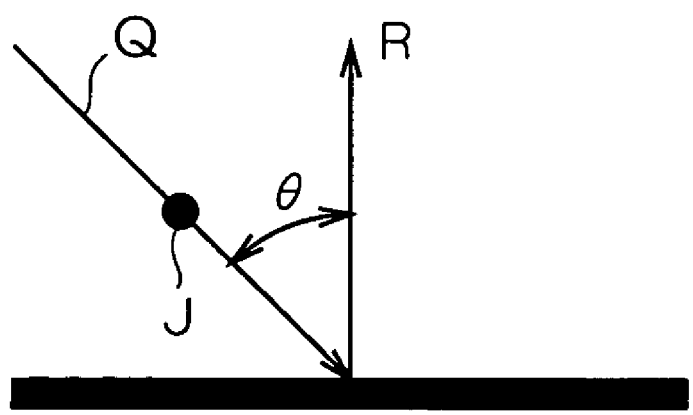

POLARIZER, PROJECTION LENS SYSTEM, EXPOSURE APPARATUS AND EXPOSING METHOD

BACKGROUND OF THE INVENTION

1. Field of the Invention

The present invention relates to a technique for manufacturing a semiconductor device, and more particularly to a technique for exposure.

2. Description of the Background Art

Semiconductor devices are continuously becoming miniaturized, and the numerical aperture (NA) of exposure apparatuses is being increased for further miniaturization.

However, as NA is getting higher, the angle of incidence on a target of exposure, e.g., a photoresist increases, which causes the effects of polarization which have been neglected to become evident. This causes degradation in imaging characteristics in the photoresist. Such circumstances are introduced in "Challenges in high NA, polarization, and photoresists" by Bruce W. Smith, et al., SPIE 2002, 4691-2, pp. 11-24. The following documents are related to the present invention: "Polarizing & Retardation Films" retrieved on May 15, 2003 from the Nitto Denko homepage <URL:http://www.nitto.co.jp/product/industry/electronics/output/lcds/polar/index.html>; Japanese Patent Application Laid-Open No. 5-226225 (1993); and Japanese Patent Application Laid-Open No. 2001-185476.

Optical systems of usual exposure apparatuses have not been able to control polarization of diffracted light generated through a mask pattern, so that polarized light incident on a photoresist includes p-polarized light and s-polarized light in an even ratio. With an increase in NA of exposure apparatuses, the angle of incidence on a target of exposure, i.e., a photoresist increases as described above, causing the ratio of p-polarized light and s-polarized light incident on the photoresist to vary. Further, since the contrast of an optical image differs between p-polarized light and s-polarized light, the contrast of an optical image generated by composition of p-polarized light and s-polarized light is degraded. Then, improvement in the degree of resolution cannot be expected even where NA is increased.

SUMMARY OF THE INVENTION

It is an object of the present invention to improve the contrast of an optical image generated in a photoresist, and therefore to improve resolution characteristics.

According to the present invention, a polarizer includes an even number of regions arranged adjacently to one another around a center. Directions of amplitude of light passing through the even number of regions distribute in the form of a regular polygon with an even number of members. Alternatively, the polarizer includes a plurality of transmission regions having a common center. Directions of amplitude of light passing through the plurality of regions distribute concentrically.

The polarizer is disposed with its center lying on the center of the surface of the pupil of a projection lens system in an exposure apparatus, thereby transmitting s-polarized light of illumination light in the exposure apparatus while cutting off p-polarized light. Thus, exposure using light which has passed through the polarizer can improve the contrast of an optical image, and hence, resolution characteristics can be improved.

According to the present invention, a projection lens system employs the polarizer as a pupil filter.

Therefore, variations in exposure characteristics of an exposure apparatus can be reduced, even when an increase in the numerical aperture of the projection lens system widens the range of distributions of the angle of incidence.

According to the present invention, an exposure apparatus employs the projection lens system.

Therefore, exposure using s-polarized light of illumination light can improve the contrast of an optical image, and hence, resolution characteristics can be improved.

According to the present invention, an exposure method uses a mask with a light shielding portion and a pupil filter. A direction in which the light shielding portion extends is in parallel to a direction of amplitude of polarized light transmitted through the pupil filter.

S-polarized light of illumination light is transmitted at exposure, while p-polarized light is cut off. Therefore, exposure using light which has passed through the polarizer can improve the contrast of an optical image, and hence, resolution characteristics can be improved.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2 and 3 show the direction of amplitude of incident light;

DESCRIPTION OF THE PREFERRED EMBODIMENTS

First Preferred Embodiment

Figure 1:
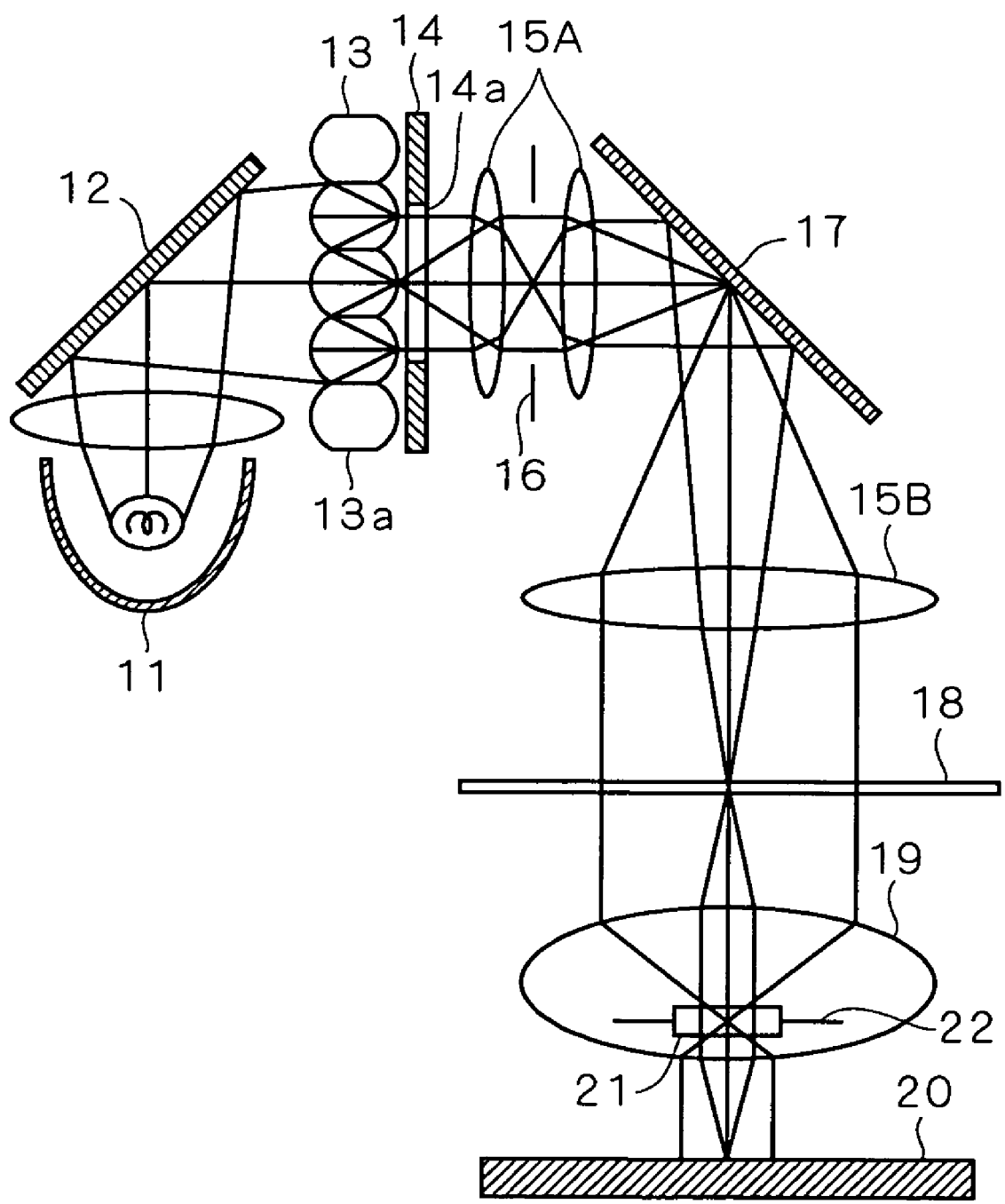
FIG. 1 shows an optical system of a projection exposure apparatus to which the present invention is applicable.

FIG. 1 shows an optical system of a projection exposure apparatus to which the present invention is applicable. Illumination light emanated from a lamp house 11 is reflected off a mirror 12, and passes through a fly eye lens 13, an aperture member 14, a relay lens 15A and a blind 16 in this order, and is further reflected off a mirror 17.

The fly eye lens 13 is divided into a plurality of lens regions 13*a*, and light emitted from the respective lens regions 13*a* pass through an opening of the aperture member 14. On the surface of a photomask 18, the light rays from the individual lens regions 13*a* are laid on top of one another, which means the lens regions 13*a* contribute to uniform illumination.

The illumination light reflected off the mirror 17 reaches the photomask 18 with a circuit pattern formed thereon, through a condenser lens 15B. The light which has passed through the photomask 18 (including diffracted light) passes through a projection lens system 19 to reach a wafer 20. A photoresist not shown is provided on a surface of the wafer 20 that faces the projection lens system 19 and is exposed to the illumination light which has passed through the projection lens system 19.

The projection lens system 19 includes an aperture stop 22, and a polarizer 21 for transmitting s-polarized light and cutting off p-polarized light is provided as a pupil filter on the surface of the pupil of the projection lens system 19. Advantages of transmitting s-polarized light in the present invention will be discussed now.

FIGS. 2 and 3 schematically show the directions of amplitude J of light in the case where incident light Q incident on a target is p-polarized light and s-polarized light, respectively. When the incident light Q is p-polarized light, the directions of amplitude J of light are in parallel to the plane decided by the direction of the normal R to the target and the direction of the incident light Q, as shown in FIG. 2. When the incident light Q is s-polarized light, the directions of amplitude J of light are perpendicular to that plane, as shown in FIG. 3.

Figure 4:
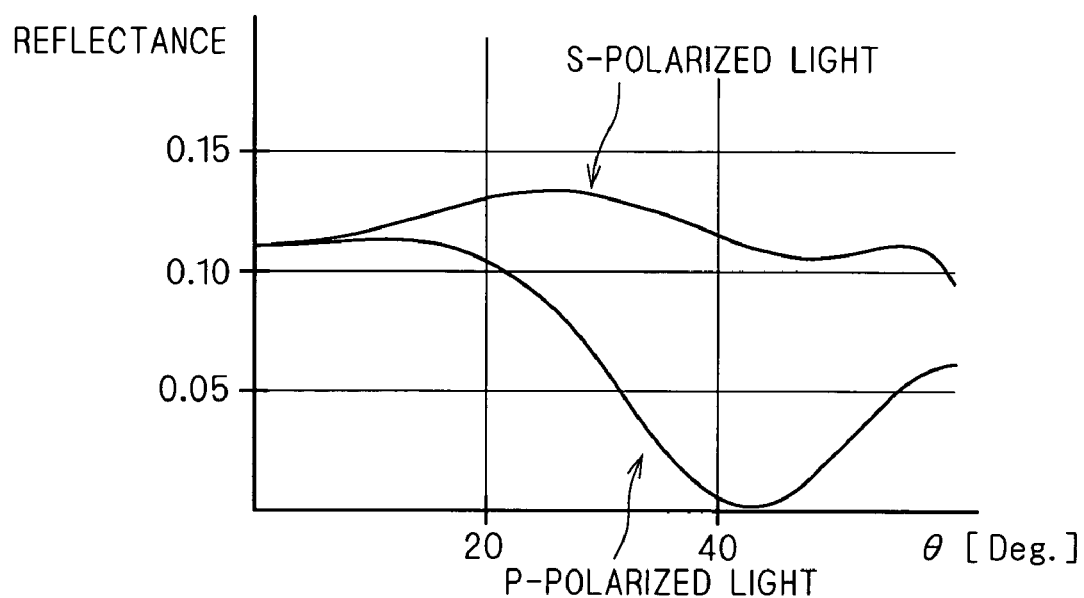
FIG. 4 is a graph showing the reflectance of incident light.

FIG. 4 is a graph showing the reflectance of incident light Q where a target is a photoresist. The angle of incidence θ made by the direction of the normal R and the direction of the incident light Q is plotted on the horizontal axis, and the reflectance is plotted on the vertical axis. Dependence of the reflectance on the angle of incidence θ differs between s-polarized light and p-polarized light. Particularly, the reflectance of p-polarized light greatly depends on the angle of incidence θ. As NA increases, the angle of incidence θ has a wider distribution. From this point of view, it is preferable to adopt s-polarized light for exposure.

Figure 5:
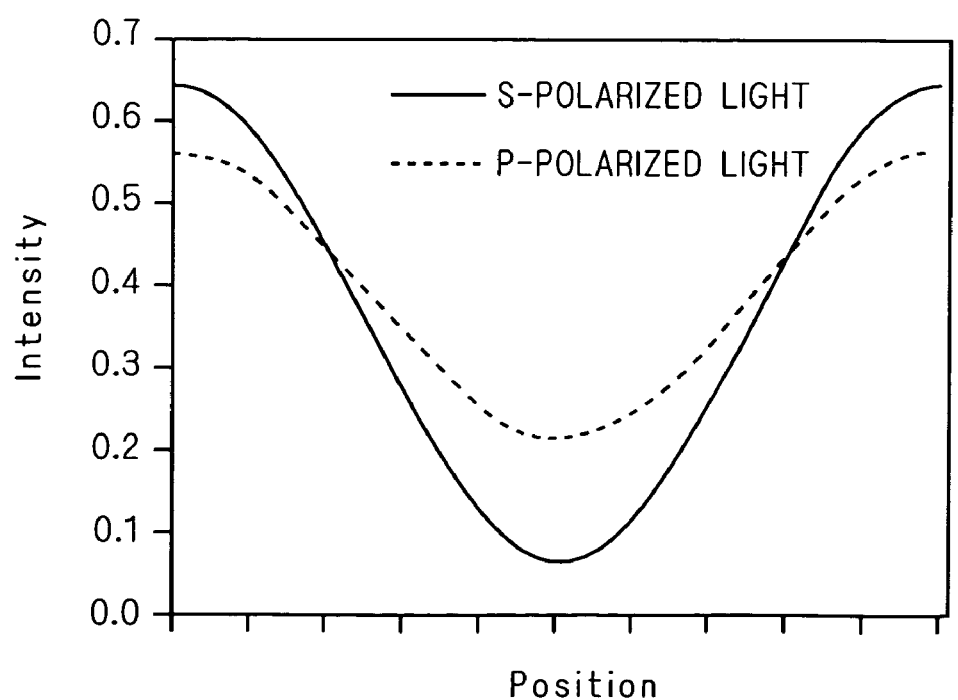
FIG. 5 is a graph showing the light intensity in a photoresist.

FIG. 5 is a graph showing the light intensity of an optical image in a photoresist. Here, NA shall be 0.707, and the photoresist shall have an index of refraction of 1.5. Such intensity distributions result from interference of light that enters the photoresist. S-polarized light has a steeper distribution than p-polarized light, and also from this point of view, it is preferable to adopt s-polarized light for exposure.

Next, a desirable structure for the polarizer 21 to transmit s-polarized light while cutting off p-polarized light will be discussed.

Figure 6:
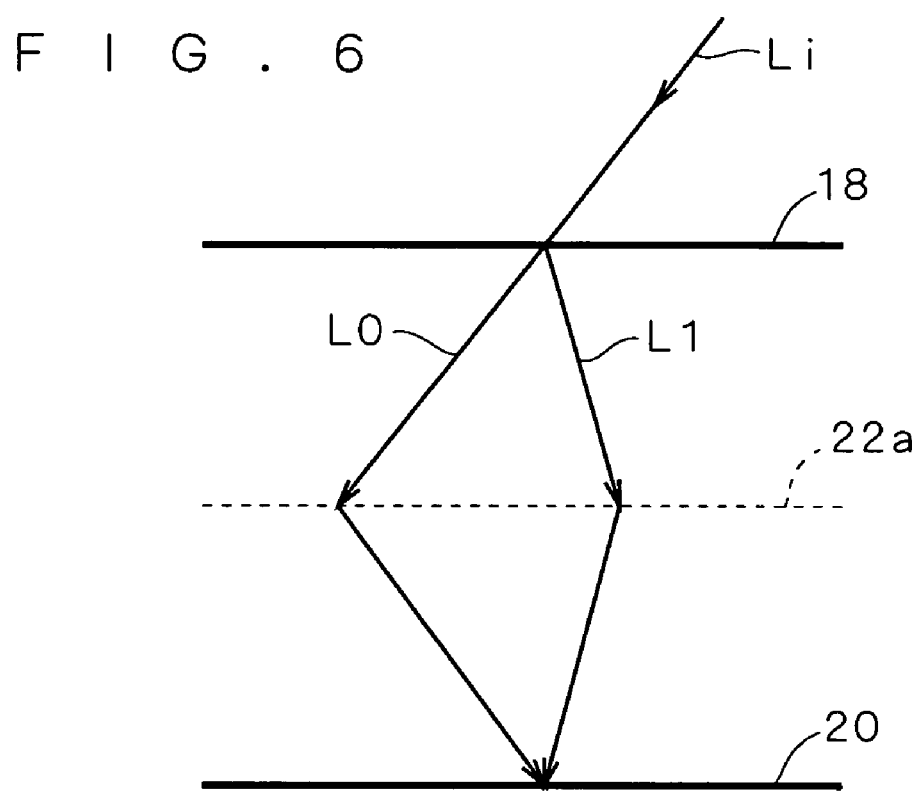
FIG. 6 conceptually shows the behavior of light transmitted through a mask.

FIG. 6 conceptually shows the behavior of light transmitted through the photomask 18. At the time when incident light Li incident on the photomask 18 passes through the edge of the pattern formed on the photomask 18, diffracted light is generated in addition to zero-order diffracted light L0 that has not been diffracted. FIG. 2 only shows first-order diffracted light L1 primarily diffracted. The zero-order diffracted light L0 and first-order diffracted light L1 pass through the surface of the pupil 22a to reach the photoresist on the wafer 20.

Figure 7:
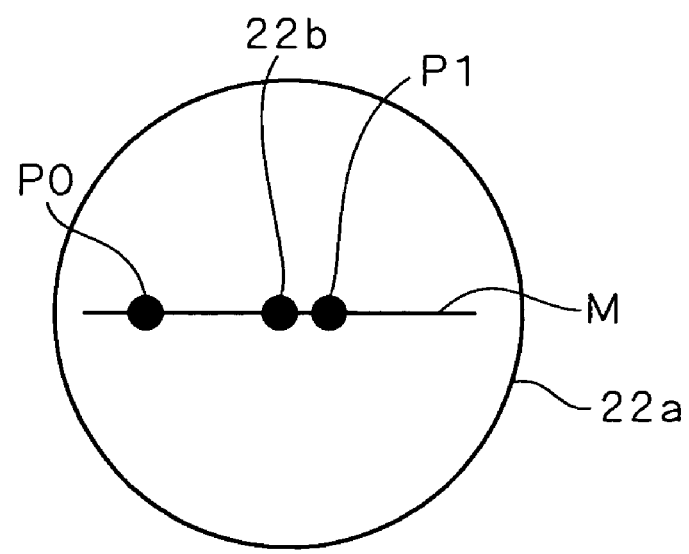
FIG. 7 conceptually shows positions where light passes through the surface of pupil.

FIG. 7 conceptually shows positions where light passes through the surface of the pupil 22a. FIG. 7 shows diffracted light of only zero and first orders. The center 22b of the surface of the pupil 22a, a position P0 through which zero-order diffracted light passes and a position P1 through which first-order diffracted light passes lie on a straight line M. Diffracted light of subsequent orders also lies on the same straight line M.

Therefore, in order to make light transmitted through the polarizer 21 s-polarized light, only polarized light that is perpendicular to lines passing through the center 22b may be passed. For instance, the polarizer 21 may only polarize light such that the directions of polarization are distributed concentrically around the center 22b.

Figure 8:
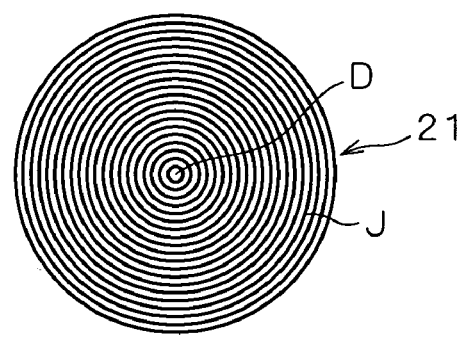
FIG. 8 shows the characteristics of a polarizer according to a first preferred embodiment of the present invention.

FIG. 8 schematically shows the directions of amplitude J of polarized light passing through the polarizer 21. The directions of amplitude J are concentric with respect to a position D. This can be said that a plurality of transmission regions commonly centering at the position D are provided, and the directions of amplitude of light passing through these regions distribute concentrically. For instance, a polyvinyl alcohol film is dyed with and adsorbs iodine or organic dye and the film is drawn, so that a filter for transmitting polarized light traveling in a predetermined direction is generated (see e.g., aforementioned "Polarizing & Retardation Films"), and the filter thus generated is drawn isotropically with respect to its center. The polarizer 21 is thereby manufactured.

The polarizer 21 is disposed on the surface of the pupil 22a such that the position D lies exactly on the center 22b. The rays of luminous flux of illumination light which have passed through the polarizer 21 are converged onto the wafer 20 with concentric planes of polarization with respect to the optical axis. That is, the illumination light is incident on the photoresist in the form of s-polarized light.

Through the use of such polarizer 21, the illumination light is incident on the photoresist on the wafer 20 in the form of s-polarized light in the projection lens system 19, so that the amount of light entering the photoresist is less likely to depend upon the angle of incidence θ. This can reduce variations in exposure characteristics of an exposure apparatus, even when an increase in NA of the projection lens system 19 widens the range of distribution of the angle of incidence θ. Further, an optical image in the photoresist becomes steeper to improve its contrast, which therefore improves resolution characteristics.

Second Preferred Embodiment

Figure 9:
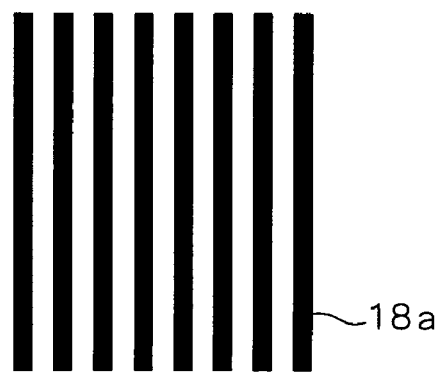
FIGS. 9 to 11 show the characteristics of a polarizer according to a second preferred embodiment of the invention.

In the present embodiment, another mode of the polarizer 21 will be described, by way of example. FIG. 9 illustrates a pattern on the photomask 18. In the pattern, a plurality of light shielding portions 18a extending in one direction are arranged at intervals in parallel to one another. Light incident on the photomask 18 passes through the intervals, while the light shielding portions 18a shield the incident light.

Figure 10:
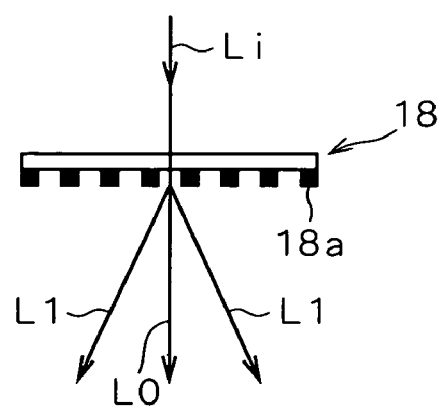

FIG. 10 schematically shows the behavior of diffracted light generated by the photomask 18, seen in a direction parallel to that in which the light shielding portions 18a extend.

Incident light Li, after passing through the intervals between the light shielding portions 18a, is split into zero-order diffracted light L0 and first-order diffracted light L1 (or higher-order diffracted light). Since the light shielding portions 18a extend in one direction, the diffracted light has the direction of polarization having a component parallel to that of the extending direction of the light shielding portions 18a except at the ends of the light shielding portions 18a in its extending direction.

Figure 11:
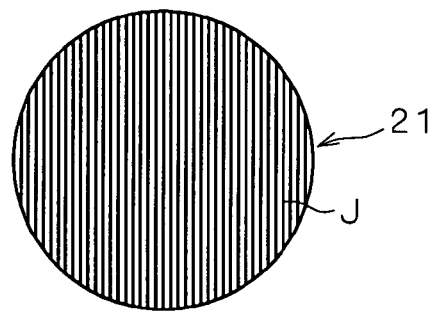

Therefore, as shown in FIG. 9, in exposure using the light shielding portions 18a extending in one direction, causing the polarizer 21 to transmit only polarized light traveling in the extending direction of the light shielding portions 18a allows s-polarized light to be transmitted. FIG. 11 schematically shows the directions of amplitude J of polarized light passing through the polarizer 21. The directions of amplitude J of polarized light are aligned in one direction.

Disposing the polarizer 21 on the surface of the pupil 22a (FIG. 6) such that the directions of amplitude of polarized light passing through the polarizer 21 are in parallel to the extending direction of the light shielding portions 18a can achieve the same effects as in the first preferred embodiment as to exposure using the light shielding portions 18a.

The effects of the present embodiment become more apparent as the light shielding portions 18a extending in one direction occupy a larger area on the photomask 18. However, in the case where the pattern on the photomask 18 extends in various directions, it is preferable to adopt the polarizer 21 that makes the directions of amplitude of light passing there-through concentric, such as that shown in FIG. 8, by way of example, in the first preferred embodiment.

Third Preferred Embodiment

Figure 12:
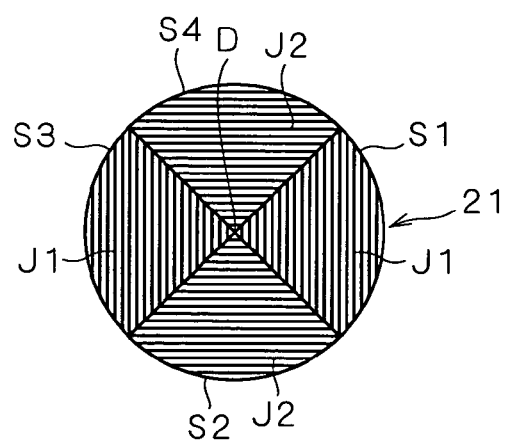
FIGS. 12 and 13 show the characteristics of a polarizer according to a third preferred embodiment of the invention.

FIG. 12 schematically shows the directions of amplitude J1 and J2 of light passing through the polarizer 21 according to the present embodiment. The polarizer 21 is equally divided in to four regions S1 to S4 centering at a position D. The direction of amplitude J1 of polarized light passing through the regions S1 and S3 facing each other and the direction of amplitude J2 of polarized light passing through the regions S2 and S4 facing each other are perpendicular to each other.

Therefore, where there exist two pairs of light shielding portions in the pattern on the photomask 18, each pair extending in one direction, and the extending directions of the two pairs cross each other at 90 (=360/4) degrees, the same effects as in the second preferred embodiment can be achieved. When disposing the polarizer 21 on the surface of the pupil 22a (FIG. 6), it is preferable that the directions of amplitude J1 and J2 and the extending directions of the two pairs of light shielding portions match, respectively.

Figure 13:
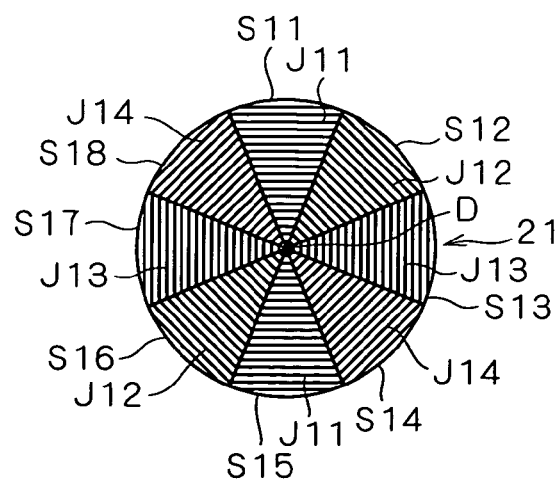

FIG. 13 schematically shows the directions of amplitude J1 to J4 of polarized light passing through the polarizer 21 according to the present embodiment. The polarizer 21 is equally divided into eight regions S11 to S18 around the position D. The direction of amplitude J11 of polarized light passing through the regions S11 and S15 facing each other crosses the direction of amplitude J12 of polarized light passing through the regions S12 and S16 facing each other at 45 degrees. The direction of amplitude J13 of polarized light passing through the regions S13 and S17 facing each other crosses the direction of amplitude J12 at 45 degrees. The direction of amplitude J14 of polarized light passing through the regions S14 and S18 facing each other crosses the direction of amplitude J13 at 45 degrees. The directions of amplitude J11 and J14 cross each other at 45 degrees.

Therefore, where there exist four pairs of light shielding portions in the pattern on the photomask 18, each pair extending in one direction, and the extending directions of the four pairs cross one another at 45 (=360/8) degrees, the same effects as in the second preferred embodiment can be achieved. When disposing the polarizer 21 on the surface of the pupil 22a (FIG. 6), it is preferable that the directions of amplitude J11 to J14 and the extending directions of the four pairs of light shielding portions match, respectively.

Further considered is a general case in which the number of directions of amplitude of polarized light passing through the polarizer 21 is N and a minimum positive angle made by the respective directions of amplitude is (360/2N) degrees. In this case, the polarizer 21 is equally divided into 2N regions, and polarized light passing through regions facing each other has the same direction of amplitude. That is, distributions of the directions of polarized light passing through the polarizer 21 form a regular polygon with 2N members.

The use of such polarizer 21 in the case where there exist N pairs of light shielding portions in the pattern on the photomask 18, each pair extending in one direction, and the extending directions of the respective pairs cross each other at a positive minimum angle of (360/2N) degrees can achieve the same effects as in the second preferred embodiment.

Fourth Preferred Embodiment

Figure 14:
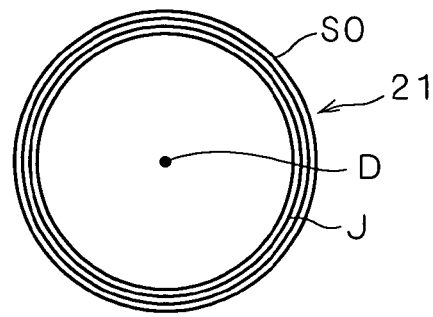
FIGS. 14 to 16 show the characteristics of a polarizer according to a fourth preferred embodiment of the invention.

FIG. 14 schematically shows the directions of amplitude J of polarized light passing through the polarizer 21 according to the present embodiment. The polarizer 21 has a ring-shaped region S0 centering at the position D. The region S0 is interposed between two circles concentric with respect to the position D. Selection of polarized light is not conducted in the range surrounded by the region S0, but incident light is transmitted.

The directions of amplitude J of polarized light are concentric with respect to the position D, similarly to the directions shown in FIG. 8. The polarizer 21 is disposed on the surface of the pupil 22a such that the position D lies exactly on the center 22b. The polarizer 21 may consist of the region S0 alone.

As shown in FIG. 4, where the angle of incidence θ is about 40 degrees or smaller, a difference in reflectivity between s-polarized light and p-polarized light increases with an increase in the angle of incidence θ. Thus, p-polarized light resulting from incident light having a great angle of incidence may be limitedly cut off. The region S0 shown in FIG. 14 is a peripheral portion with respect to the center D, where the angle of incidence is great. Therefore, the use of the polarizer 21 according to the present embodiment can improve the contrast of illumination light made incident at such an angle that resolution characteristics significantly degrade, similarly to the first preferred embodiment.

Figure 15:
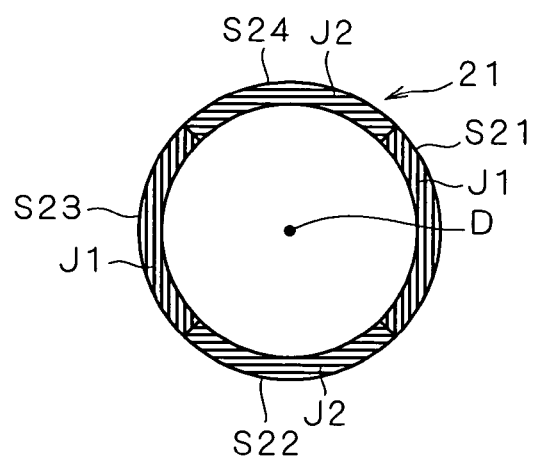
Figure 16:
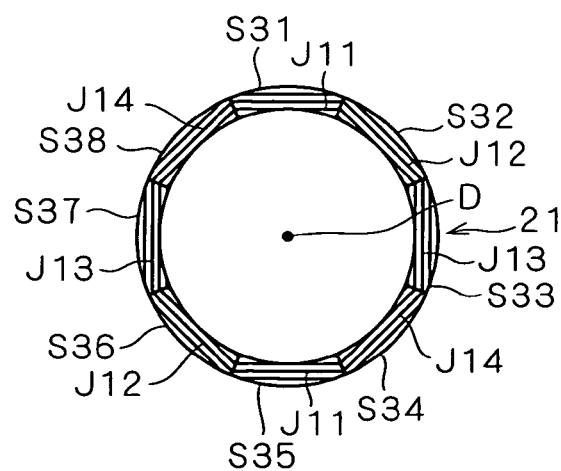

FIGS. 15 and 16 each schematically show the directions of amplitude of polarized light passing through another type of polarizer 21 according to the present embodiment. FIG. 15 shows the structure in which the regions S1 to S4 of the polarizer 21 shown in FIG. 12 are transformed into regions S21 to S24 limited in a range at a certain distance from the center D. FIG. 16 shows the structure in which the regions S11 to S18 are transformed into regions S31 to S38 limited in a range at a certain distance from the center D.

Even where the directions of amplitude of transmitted light are limited in a ring-shaped region as in the present embodiment, the contrast of illumination light made incident at such an angle that resolution characteristics significantly degrade can be improved, similarly to the third preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. An exposure apparatus comprising an optical system employing a polarizer, wherein
    said polarizer includes an even number of regions arranged adjacently to one another around a center and is provided on the surface of a pupil of said optical system, and
    directions of amplitude of light passing through said even number of regions distribute in the form of a regular polygon with an even number of members.

2. The exposure apparatus according to claim 1, wherein said even number of regions are arranged annularly.

3. The exposure apparatus according claim to claim 1, wherein
    an illumination light passing through said polarizer is incident on a photoresist over a wafer and expose said photoresist, and
    content of s-polarized light in said illumination light incident on said photoresist is larger than content of p-polarized light in said illumination light.

* * * * *